(12) United States Patent
Brink et al.

(10) Patent No.: US 8,916,054 B2
(45) Date of Patent: *Dec. 23, 2014

(54) HIGH FIDELITY PATTERNING EMPLOYING A FLUOROHYDROCARBON-CONTAINING POLYMER

(75) Inventors: Markus Brink, White Plains, NY (US); Sebastian U. Engelmann, New York, NY (US); Nicholas C. M. Fuller, North Hills, NY (US); Michael A. Guillorn, Yorktown Heights, NY (US); Hiroyuki Miyazoe, White Plains, NY (US); Masahiro Nakamura, Eastchester, NY (US)

(73) Assignees: International Business Machines Corporation, Armonk, NY (US); Zeon Corporation, Tokyo (JP)

( * ) Notice: Subject to any disclaimer, the term of this patent is extended or adjusted under 35 U.S.C. 154(b) by 349 days.

This patent is subject to a terminal disclaimer.

(21) Appl. No.: 13/281,749

(22) Filed: Oct. 26, 2011

(65) Prior Publication Data

US 2013/0108833 A1  May 2, 2013

(51) Int. Cl.
| | |
|---|---|
| *B44C 1/22* | (2006.01) |
| *H01L 21/033* | (2006.01) |
| *H01L 21/311* | (2006.01) |
| *G03F 7/40* | (2006.01) |
| *G03F 7/09* | (2006.01) |

(52) U.S. Cl.
CPC ............ *G03F 7/094* (2013.01); *H01L 21/0332* (2013.01); *G03F 7/40* (2013.01); *H01L 21/31138* (2013.01); *H01L 21/31122* (2013.01); *H01L 21/31116* (2013.01); *G03F 7/091* (2013.01); *H01L 21/31144* (2013.01)

USPC ................. 216/47; 216/41; 216/67; 430/313

(58) Field of Classification Search
CPC ..................... H01L 21/0332; H01L 21/31116; H01L 21/31138; H01L 21/31144; G03F 7/20
USPC ................................ 216/41, 47, 67; 430/313
See application file for complete search history.

(56) References Cited

U.S. PATENT DOCUMENTS 6,287,951 B1  9/2001 Lucas et al.
6,300,251 B1  10/2001 Pradeep et al.

(Continued)

OTHER PUBLICATIONS

International Search Report and Written Opinion dated Dec. 28, 2012, issued in International Application No. PCT/US12/61515.

*Primary Examiner* — Shamim Ahmed
(74) *Attorney, Agent, or Firm* — Scully, Scott, Murphy & Presser, P.C.; Louis J. Percello, Esq.

(57) ABSTRACT

A stack of a hard mask layer, a soft mask layer, and a photoresist is formed on a substrate. The photoresist is patterned to include at least one opening. The pattern is transferred into the soft mask layer by an anisotropic etch, which forms a carbon-rich polymer that includes more carbon than fluorine. The carbon-rich polymer can be formed by employing a fluorohydrocarbon-containing plasma generated with fluorohydrocarbon molecules including more hydrogen than fluorine. The carbon-rich polymer coats the sidewalls of the soft mask layer, and prevents widening of the pattern transferred into the soft mask. The photoresist is subsequently removed, and the pattern in the soft mask layer is transferred into the hard mask layer. Sidewalls of the hard mask layer are coated with the carbon-rich polymer to prevent widening of the pattern transferred into the hard mask.

12 Claims, 12 Drawing Sheets

(56) References Cited

U.S. PATENT DOCUMENTS

| | | |
|---|---|---|
| 6,797,552 B1 | 9/2004 | Chang et al. |
| 7,008,866 B2 | 3/2006 | Huang et al. |
| 7,078,351 B2 | 7/2006 | Chiu et al. |
| 7,405,161 B2 | 7/2008 | Jang et al. |
| 7,732,340 B2 | 6/2010 | Nagaiwa et al. |
| 7,754,591 B2 | 7/2010 | Jung |
| 7,857,982 B2 * | 12/2010 | Abatchev et al. ............... 216/13 |
| 8,557,131 B2 * | 10/2013 | Koh et al. ............... 216/41 |
| 2004/0129361 A1 | 7/2004 | Chen et al. |
| 2004/0157444 A1 | 8/2004 | Chiu et al. |
| 2006/0105557 A1 | 5/2006 | Klee et al. |
| 2006/0183308 A1 | 8/2006 | Zhang et al. |
| 2009/0142931 A1 * | 6/2009 | Wang et al. ............... 438/734 |
| 2011/0049099 A1 | 3/2011 | Kamp |
| 2011/0136345 A1 | 6/2011 | Riva |
| 2011/0237080 A1 | 9/2011 | Liu et al. |
| 2013/0105996 A1 * | 5/2013 | Brink et al. ............... 257/786 |

* cited by examiner

HIGH FIDELITY PATTERNING EMPLOYING A FLUOROHYDROCARBON-CONTAINING POLYMER

BACKGROUND

The present disclosure relates to semiconductor processing methods, and particularly to methods for high fidelity patterning employing a high density plasma, and structures for effecting the same.

Pattern transfer at small dimensions and small pitch solutions requires high precision. A typical phenomenon for pattern transfer at small dimension is the deformation of the patterning materials as a result of plasma processing. The deformation typically occurs when a mask in a soft (carbon-based) material is transferred into a harder material (such as a semiconductor material, silicon oxide, silicon nitride, silicon oxynitride, and metallic materials).

The deformation of the pattern is known to originate from substantial modification of the soft material by the plasma that eventually leads to mechanical failure of the soft material. In particular, interaction of a plasma polymer with a soft patterning material can cause substantial problems.

Proposed solutions to this problem include use of novel patterning materials or use of hardening processes. Suitable novel patterning materials capable of a high fidelity pattern transfer are difficult to identify. Hardening processes require treatment at elevated temperatures, which can adversely impact device performance due to the undesirable effect of additional thermal cycling on device performance. A novel approach has also been proposed in which alternative patterning materials having stoichiometries tailored to reduce the occurrence of the phenomenon of pattern deformation are employed.

BRIEF SUMMARY

A stack of a hard mask layer and a soft mask layer is deposited on a substrate. A photoresist is applied over the soft mask layer, and is lithographically patterned to form at least one opening therein. The pattern of the at least one opening is transferred into the soft mask layer by an anisotropic etch, which forms a carbon-rich polymer that includes more carbon than fluorine. The carbon-rich polymer can be formed by employing a fluorohydrocarbon-containing plasma generated with fluorohydrocarbon molecules including more hydrogen than fluorine. The carbon-rich polymer coats the sidewalls of the soft mask layer, and prevents widening of the pattern transferred into the soft mask. The pattern in the soft mask layer is transferred into the hard mask layer. Sidewalls of the hard mask layer are coated with the carbon-rich polymer to prevent widening of the pattern transferred into the hard mask. The carbon-rich polymer effects high fidelity pattern transfer by minimizing lateral widening of openings within the soft mask layer and within the hard mask layer.

According to an aspect of the present disclosure, a method of forming a patterned structure is provided, which includes: forming a stack including, from bottom to top, a substrate, a hard mask layer that is not carbon-based, a soft mask layer including a carbon-based material, and a photoresist; lithographically patterning the photoresist; and transferring a pattern in the photoresist into the soft mask layer employing an anisotropic etch. A carbon-rich polymer including carbon and fluorine is formed on sidewalls around an opening of the soft mask layer, wherein an atomic ratio of carbon to fluorine is greater than 1 within the carbon-rich polymer.

According to another aspect of the present disclosure, another method of forming a patterned structure is provided. The method includes: forming a stack including, from bottom to top, a substrate, a hard mask layer that is not carbon-based, a soft mask layer including a carbon-based material, and a photoresist; lithographically patterning the photoresist; patterning the soft mask layer by transferring a pattern in the photoresist into the soft mask layer; and transferring a pattern in the soft mask layer into the hard mask layer employing an anisotropic etch. A carbon-rich polymer including carbon and fluorine is formed contiguously on a top surface of the soft mask layer, on sidewalls of the soft mask layer, and on sidewalls of the hard mask layer. The atomic ratio of carbon to fluorine is greater than 1 within the carbon-rich polymer.

According to yet another aspect of the present disclosure, a patterned structure is provided. The patterned structure includes: a stack including, from bottom to top, a substrate, a hard mask layer that is not carbon-based, a soft mask layer including a carbon-based material; and a carbon-rich polymer including carbon and fluorine and located on sidewalls around an opening of the soft mask layer, wherein an atomic ratio of carbon to fluorine is greater than 1 within the carbon-rich polymer.

DETAILED DESCRIPTION

Figure 1:
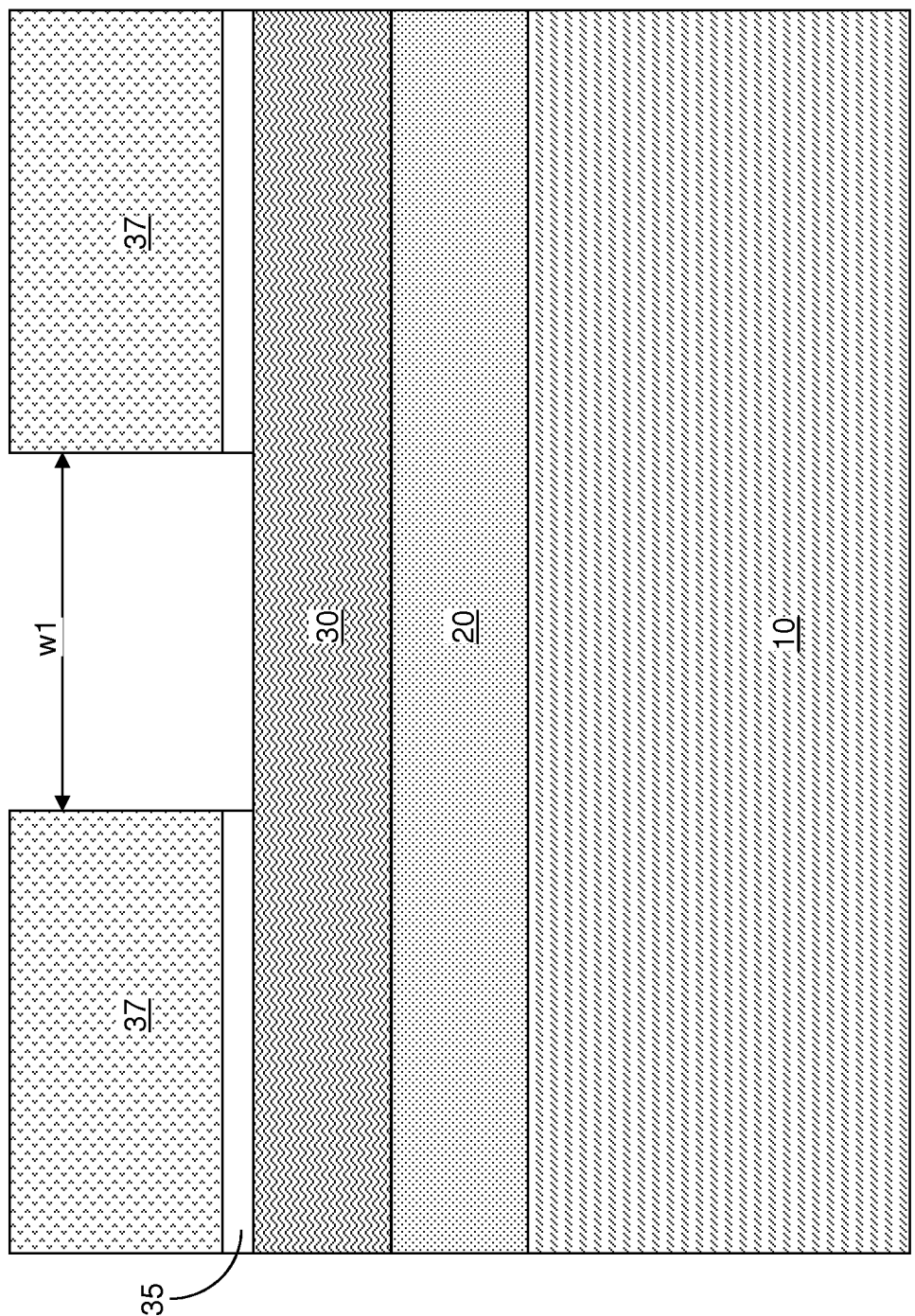
FIG. 1 is a vertical cross-sectional view of a first exemplary structure after lithographic patterning of a photoresist according to a first embodiment of the present disclosure.

As stated above, the present disclosure relates to methods for high fidelity patterning employing a high density plasma, and structures for effecting the same, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present disclosure includes a substrate 10, a hard mask layer 20, a soft mask layer 30, and a photoresist 37.

The substrate 10 can include a semiconductor material, an insulator material, a conductive material, or a combination thereof. The semiconductor material can be an elemental semiconductor material such as silicon, germanium, carbon, or an alloy thereof, a III-V compound semiconductor material, a II-VI compound semiconductor material, or any combination or stack thereof. The semiconductor material can be doped with electrical dopants such as B, Ga, In, P, As, and Sb. Multiple semiconductor materials can be present in the substrate. The insulator material can be doped or undoped silicon oxide, doped derivatives of silicon oxide, silicon nitride, silicon oxynitride, a dielectric metal oxide having a dielectric constant greater than 3.9, or a combination or stack thereof. Multiple insulator materials can be present in the substrate 10. The conductive material can include a metallic material such as Cu, W, Ti, Ta, Al, WN, TiN, TaN, WC, TiC, TiC, or alloys thereof. The substrate 10 can include at least one semiconductor device (not shown) such as a field effect transistor, a junction transistor, a diode, a thyristor, a capacitor, an inductor, or any other semiconductor device or optical device known in the art. Further, the substrate 10 can include a contact-level dielectric material layer and contact via structures embedded therein. In addition, the substrate 10 can include at least one interconnect-level dielectric material layer and metal interconnect structures as known in the art.

The hard mask layer 20 includes a material that is not carbon-based. As used herein, a material is "carbon-based" if more than 10% all bonds within the material are bonds to at least one carbon atom. Thus, a material is not carbon-based if the percentage of all bonds with the material that includes at least one carbon atom is 10% or less. The hard mask layer 20 includes a material different from a predominant material of the upper portion of the substrate 10. In one embodiment, the hard mask layer 20 includes a dielectric material such as silicon oxide, silicon nitride, silicon oxynitride, a dielectric metal oxide, or a combination thereof. The hard mask layer 20 can be formed, for example, by chemical vapor deposition (CVD). The thickness of the hard mask layer 20 can be from 5 nm to 300 nm, although lesser and greater thicknesses can also be employed.

The soft mask layer 30 includes a carbon-based material. In one embodiment, the carbon-based material of the soft mask layer 30 is not photosensitive. The soft mask layer 30 can include, for example, an organic planarizing material, a bottom anti-reflective coating (BARC) material, or a stack thereof. In one embodiment, the soft mask layer 30 can include a non-photosensitive organic polymer including at least C, O, and H.

The organic planarizing material may be an organic polymer including C, H, and N. The organic planarizing material is capable of generating etch residues during a reactive ion etch process that is re-deposited on unetched portions of the organic planarizing layer. In one embodiment, the organic planarizing material can be free of fluorine (F). In one embodiment, the organic planarizing material can be free of silicon (Si). As defined herein, a material is free of an atomic element when the level of the atomic element in the material is at or below a trace level detectable with analytic methods available in the art. In one embodiment, the organic planarizing material may be free of Si and F. Non-limiting examples of the organic planarizing material include JSR HM8006, JSR HM8014, AZ UM10M2, Shin Etsu ODL 102, other similar commercially available materials from such vendors as JSR, TOK, Sumitomo, Rohm & Haas. The organic planarizing material can be deposited, for example, by spin coating.

The BARC material includes a material that reduces light reflection at the wavelengths of subsequent illumination on the photoresist 37. The BARC material typically includes an organic material including a light absorber material and a polymer material. For example, the BARC material may include a crosslinking agent component substituted by a hydroxylalkyl group or an alkoxyalkyl group, a benzophenone-based, diphenylsulfone-based or diphenylsulfoxide-based dye component and an acrylic resin. The BARC material may also be a Si-containing anti-reflective material, i.e., include silicon in the composition of the material. The composition of the BARC material may be optimized depending on the composition of the photoresist 37. The BARC material can be deposited, for example, by spin coating.

The thickness of the soft mask layer 20 can be from 20 nm to 600 nm, and typically from 40 nm to 300 nm, although lesser and greater thicknesses are also contemplated herein.

An optional dielectric oxide layer 35 can be formed on the top surface of the soft mask layer 20. The optional dielectric oxide layer 35 includes a dielectric oxide material, which can be, for example silicon oxide. The optional dielectric oxide layer 35 can be a spin-on-oxide deposited by spin coating and forms a silicon oxide layer after curing, or can be a silicon oxide layer deposited by chemical vapor deposition such as low temperature oxide as known in the art. The thickness of the optional dielectric oxide layer 35 can be from 5 nm to 80 nm, although lesser and greater thicknesses can also be employed.

The photoresist 37 is formed either directly on the top surface of the soft mask layer 20 or on the top surface of the optional dielectric oxide layer 35. The photoresist 37 may be formed, for example, by spin coating. The photoresist 37 can be a deep ultraviolet (DUV) photoresist, a mid-ultraviolet (MUV) photoresist, an extreme ultraviolet (EUV) photoresist, or an electron beam (e-beam) photoresist. The material of the photoresist 37 reacts to illumination by light in a wavelength range or electron irradiation, and is chemically changed, for example, by cross-linking. The thickness of the photoresist 37 can be from 30 nm to 600 nm, and typically from 60 nm to 300 nm, although lesser and greater thicknesses can also be employed.

The photoresist 37 is lithographically exposed, and is subsequently developed. An opening having a first width w1 is formed within the photoresist 37 after the lithographic exposure and development. A top surface of the soft mask layer 30 is physically exposed at the bottom of the opening in the photoresist 37.

Figure 2:
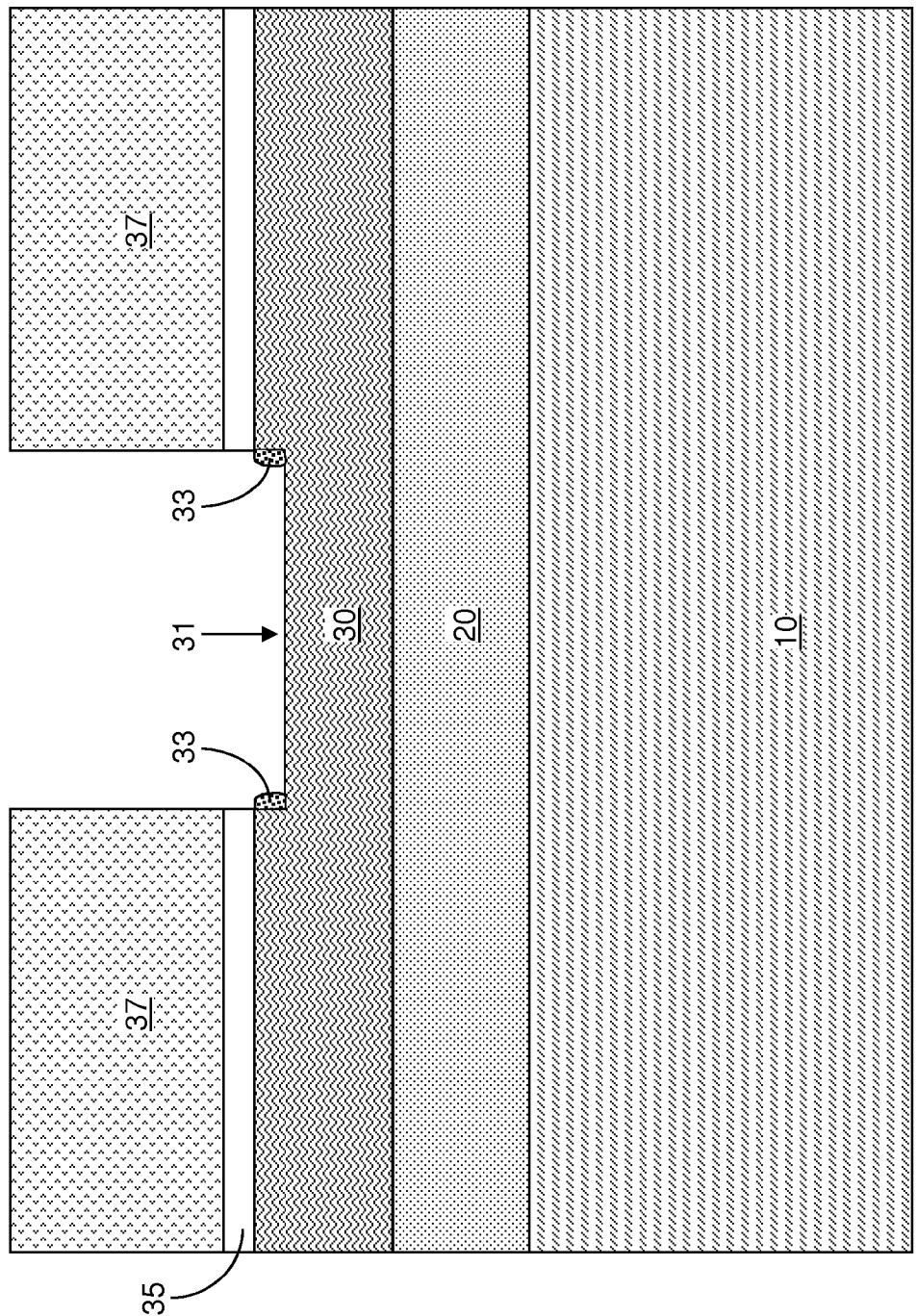
FIG. 2 is a vertical cross-sectional view of the first exemplary structure during transfer of the pattern in the photoresist into a soft mask layer according to the first embodiment of the present disclosure.

Referring to FIG. 2, the first exemplary structure is placed into a process chamber configured for a plasma etch, i.e., a reactive ion etch. A first anisotropic etch employing a first fluorohydrocarbon-containing plasma is performed on the first exemplary structure. The pattern in the photoresist 37 is transferred into an upper portion of the soft mask layer 30 during the initial phase of the first anisotropic etch.

The composition of the gas supplied into the process chamber includes one or more fluorohydrocarbon gas (hereafter referred to as "the fluorohydrocarbon gas") having a composition of $C_xH_yF_z$, wherein x is an integer selected from 3, 4, 5, and 6, y and z are positive integers, and y is greater than z. For example, the fluorohydrocarbon gas can include one or more of $C_3H_5F_3$, $C_3H_6F_2$, $C_3H_7F$, $C_3H_4F_2$, $C_3H_5F$, $C_3H_3F$, $C_4H_6F_4$, $C_4H_7F_3$, $C_4H_8F_2$, $C_4H_9F$, $C_4H_5F_3$, $C_4H_6F_2$, $C_4H_7F$, $C_4H_4F_2$, $C_4H_5F$, $C_5H_7F_5$, $C_5H_8F_4$, $C_5H_9F_3$, $C_5H_{10}F_2$, $C_5H_{11}F$, $C_5H_6F_4$, $C_5H_7F_3$, $C_5H_8F_2$, $C_5H_9F$, $C_5H_5F_3$, $C_5H_6F_2$, $C_5H_7F$, $C_6H_8F_6$, $C_6H_9F_5$, $C_6H_{10}F_4$, $C_6H_{11}F_3$, $C_6H_{12}F_2$, $C_6H_{13}F$, $C_6H_7F_5$, $C_6H_8F_4$, $C_6H_9F_3$, $C_6H_{10}F_2$, $C_6H_{11}F$, $C_6H_6F_4$, $C_6H_7F_3$, $C_6H_8F_2$, and $C_6H_9F$. Correspondingly, the first fluorohydrocarbon-containing plasma includes ions of $C_xH_yF_z$. The composition of the gas supplied into the process chamber further includes $O_2$, $N_2$, $H_2$, $NH_3$, $SO_2$, and/or COS so that the organic material of the soft mask layer 30 can be oxidized by the plasma. Thus, the first fluorohydrocarbon-containing plasma includes a plasma of $O_2$, $N_2$, $H_2$, $NH_3$, $SO_2$, and/or COS. Optionally, Ar, Ne, and/or He can be additionally flowed in the process chamber to add ions of inert gas(es) to the composition of the plasma.

Non-limiting specific examples of $C_xH_yF_z$, wherein x is an integer selected from 3, 4, 5, and 6, y and z are positive integers, and y is greater than z, include alkanes, alkenes, and alkynes.

In one embodiment, the fluorohydrocarbon gas can include one or more alkane fluorohydrocarbon gas having the formula of $C_xH_yF_z$, wherein x is an integer selected from 3, 4, and 5, y and z are positive integers, and y is greater than z. The one or more alkane fluorohydrocarbon gas can include, but are not limited to: saturated liner fluorohydrocarbons shown by $C_3H_7F$ such as 1-fluoropropane, 2-fluoropropane; saturated liner fluorohydrocarbons shown by $C_3H_6F_2$ such as 1,1-difluoropropane, 2,2-difluoropropane, 1,2-difluoropropane, 1,3-difluoropropane; saturated liner fluorohydrocarbons shown by $C_3H_5F_3$ such as 1,1,1-trifluoropropane, 1,1,2-trifluoropropane, 1,1,3-trifluoropropane, 1,2,2-trifluoropropane; saturated cyclic fluorohydrocarbon shown by $C_3H_5F$ such as fluorocyclopropane; saturated cyclic fluorohydrocarbon shown by $C_3H_4F_2$ such as 1,2-difluorocyclopropane; saturated liner fluorohydrocarbons shown by $C_4H_9F$ such as 1-fluorobutane, 2-fluorobutane; saturated liner fluorohydrocarbons shown by $C_4H_8F_2$ such as 1-fluoro-2-methylpropane, 1,1-difluorobutane, 2,2-difluorobutane, 1,2-difluorobutane, 1,3-difluorobutane, 1,4-difluorobutane, 2,3-difluorobutane, 1,1-difluoro-2-methylpropane, 1,2-difluoro-2-methylpropane, 1,3-difluoro-2-methylpropane; saturated liner fluorohydrocarbons shown by $C_4H_7F_3$ such as 1,1,1-trifluorobutane, 1,1,1-trifluoro-2-methylpropane, 1,1,2-trifluorobutane, 1,1,3-trifluorobutane, 1,1,4-trifluorobutane, 2,2,3-trifluorobutane, 2,2,4-trifluorobutane, 1,1,2-trifluoro-2-methylpropane; saturated liner fluorohydrocarbons shown by $C_4H_6F_4$ such as 1,1,1,2-tetrafluorobutane, 1,1,1,3-tetrafluorobutane, 1,1,1,4-tetrafluorobutane, 1,1,2,2-tetrafluorobutane, 1,1,2,3-tetrafluorobutane, 1,1,2,4-tetrafluorobutane, 1,1,3,3-tetrafluroobutane, 1,1,3,4-tetrafluorobutane, 1,1,4,4-tetrafluorobutane, 2,2,3,3-tetrafluorobutane, 2,2,3,4-tetrafluorobutane, 1,2,3,4-tetrafluorobutane, 1,1,1,2-tetrafluoro-2-methylpropane, 1,1,1,3-tetrafluoro-2-methylpropane, 1,1,2,3-tetrafluoro-2-methylpropane, 1,1,3,3-tetrafluoro-2-methylpropane; saturated cyclic fluorohydrocarbon shown by $C_4H_7F$ such as fluorocyclobutane; saturated cyclic fluorohydrocarbons shown by C4H6F2 such as 1,1-difluorocyclobutane, 1,2-difluorocyclobutane, 1,3-difluorocyclobutane; saturated cyclic fluorohydrocarbon shown by $C_4H_5F_3$ such as 1,1,2-trifluorocyclobutane, 1,1,3-triflurocyclobutane; saturated liner fluorohydrocarbons shown by $C_5H_{11}F$ such as 1-fluoropentane, 2-fluoropentane, 3-fluoropentane, 1-fluoro-2-methylbutane, 1-fluoro-3-methylbutane, 2-fluoro-3-methylbutane, 1-fluoro-2,2-dimethylpropane; saturated liner fluorohydrocarbons shown by $C_5H_{10}F_2$ such as 1,1-difluoropenatne, 2,2-difluoropentane, 3,3-difluoropentane, 1,2-difluoropentane, 1,3-difluoropentane, 1,4-difluoropentane, 1,5-difluoropentane, 1,1-difluoro-2-methylbutane, 1,1-difluoro-3-methylbutane, 1,2-difluoro-2-methylbutane, 1,2-difluoro-3-methylbutane, 1,3-difluoro-2-methylbutane, 1,3-difluoro-3-methylbutane, 1,4-difluoro-2-methylbutane, 2,2-difluoro-3-methylbutane, 2,3-difluoro-2-methylbutane, 1,1-difluoro-2,2-dimethylpropane, 1,3-difluoro-2,2-dimethylproapne, 1-fluoro-2-fluoromethylbutane; saturated liner fluorohydrocarbons shown by $C_5H_9F_3$ such as 1,1,1-trifluoropentane, 1,1,2-trifluoropentane, 1,1,3-trifluoropentane, 1,1,4-trifluoropentane, 1,1,1-trifluoro-2-methylbutane, 1,1,2-trifluoro2,3-dimethylpropane; saturated cyclic fluorohydrocarbons shown by $C_5H_9F$ such as fluorocyclopentane, 1-fluoro-2-methylcyclobutane, 1-fluoro-3-methylcyclobutane, (fluoromethyl)-cyclobutane; saturated cyclic fluorohydrocarbons shown by $C_5H_8F_2$ such as 1,2-difluorocyclopentane, 1,3-difluorocyclopentane, 1,1-difluoro-2-methylcyclobutane, 1,1-difluoro-3-methylcyclobutane; saturated cyclic fluorohydrocarbons shown by $C_5H_7F_3$ such as 1,1,2-trifluorocyclopentane, 1,2,3-trifluorocyclopentane.

Additionally or alternatively, the fluorohydrocarbon gas can include one or more alkene fluorohydrocarbon gas having the formula of $C_xH_yF_z$, wherein x is an integer selected from 3, 4, and 5, y and z are positive integers, and y is greater than z. The one or more alkene fluorohydrocarbon gas can include, but are not limited to: unsaturated liner fluorohydrocarbons shown by $C_3H_5F$ such as 3-fluoropropene, 1-fluoropropene, 2-fluoropropene; unsaturated liner fluorohydrocarbons shown by $C_3H_4F_2$ such as 1,1-difluoropropene, 3,3-difluoropropene; unsaturated cyclic fluorohydrocarbons shown by C3H3F such as 3-fluorocyclopropene, 1-fluorocyclopropene; unsaturated liner fluorohydrocarbons shown by $C_4H_7F$ such as 1-fluorobutene, 2-fluorobutene, 3-fluorobutene, 4-fluorobutene, 1-fluoro-2-butene, 2-fluoro-2-butene, 1-fluoro-2-methylpropene, 3-fluoro-2-methylpropene, 2-(fluoromethyl)-propene; unsaturated liner fluorohydrocarbons shown by $C_4H_6F_2$ such as 1,1-difluoro-2-methylpropene, 3,3-difluoro-2-methylpropene, 2-(fluoromethyl)-fluoropropene, 3,3-difluorobutene, 4,4-difluorobutene, 1,2-difluorobutene, 1,1-difluoro-2-butene, 1,4-difluoro-2-butene; unsaturated liner fluorohydrocarbons shown by $C_4H_5F_3$ such as 4,4,4-trifluorobutene, 3,3,4-trifluorobutene, 1,1,1-trifluoro-2-butene, 1,1,4-trifluoro-2-butene; unsaturated cyclic fluorohydrocarbons shown by $C_4H_5F$ such as 1-fluorocyclobutene, 3-fluorocyclobutene; unsaturated cyclic fluorohydrocarbons shown by $C_4H_4F_2$ such as 3,3-difluorocyclobutene, 3,4-difluorocyclobutene; unsaturated liner fluorohydrocarbons shown by $C_5H_9F$ such as 1-fluoropentene, 2-fluoropenten, 3-fluoropenten, 4-fluoropentene, 5-fluoropenten, 1-fluoro-2-pentene, 2-fluoro-2-pentene, 3-fluoro-2-pentene, 4-fluoro-2- pentene, 5-fluoro-2-pentene, 1-fluoro-2-methylbutene, 1-fluoro-3-methylbutene, 3-fluoro-2-methylbutene, 3-fluoro-3-methylbutene, 4-fluoro-2-methylbutene, 4-fluoro-3-methylbutene, 1-fluoro-2-methyl-2-butene, 1-fluoro-3-methyl-2-butene, 2-fluoro-3-methyl-2-butene, 2-(fluoromethyl)-butene; unsaturated liner fluorohydrocarbons shown by $C_5H_8F_2$ such as 3,3-difluoropentene, 4,4-difluoropentene, 5,5-difluoropentene, 1,2-difluoropentene, 3,4-difluoropentene, 3,5-difluoropentene, 4,5-difluoropentene; unsaturated cyclic fluorohydrocarbons shown by $C_5H_7F$ such as 1-fluorocyclopentene, 3-fluorocylopentene, 4-fluorocyclopentene; unsaturated cyclic fluorohydrocarbons shown by $C_5H_6F_2$ such as 3,3-difluorocyclopentene, 4,4-difluorocyclopentene, 1,3-difluorocyclopentene, 1,4-difluorocyclopentene, 3,5-difluorocyclopentene.

Additionally or alternatively, the fluorohydrocarbon gas can include one or more alkyne fluorohydrocarbon gas having the formula of $C_xH_yF_z$, wherein x is an integer selected from 3, 4, and 5, y and z are positive integers, and y is greater than z. The one or more alkyne fluorohydrocarbon gas can include, but are not limited to: unsaturated liner fluorohydrocarbon shown by $C_3H_3F$ such as 3-fluoropropyne; unsaturated liner fluorohydrocarbon shown by $C_3H_2F_2$ such as 3,3-difluoropropyne; unsaturated liner fluorohydrocarbons shown by $C_4H_5F$ such as 3-fluorobutyne, 4-fluorobutyne, 1-fluoro-2-butyne; unsaturated liner fluorohydrocarbons shown by $C_4H_4F_2$ such as 3,3-difluorobutyne, 4,4-difluorobutyne, 3,4-difluorobutyne, 1,4-difluoro-2-butyne; unsaturated liner fluorohydrocarbons shown by $C_5H_7F$ such as 3-fluoropentyne, 4-fluoropentyne, 5-fluoropentyne, 1-fluoro-2-pnetyne, 4-fluoro-2-pentyne, 5-fluoro-2-pentyne, 3-(fluoromethyl)-butyne; unsaturated liner fluorohydrocarbons shown by $C_5H_6F_2$ such as 3,3-difluoropentyne, 4,4-difluoropentyne, 5,5-difluoropentyne, 3,4-difluoropentyne, 4,5-difluoropentyne, 1,1-difluoro-2-pentyne, 4,4-difluor-2-pentyne, 5,5-difluoro-2-pentyne, 4,5-difluoro-2-pentyne, 3-(difluoromethyl)-butyne, 3-(fluoromethyl)-4-fluorobutyne.

In one embodiment, an additional fluorohydrocarbon gas having a composition of $C_jH_kF_l$ may be added to the fluorohydrocarbon gas having the composition of $C_xH_yF_z$, wherein j is an integer selected from 1 and 2, and/or k is lesser than 1. The admixture of the $C_jH_kF_l$ gas to the $C_xH_yF_z$, can generate a hydrofluorocarbon-containing polymer having a high carbon content and high density on the sidewalls of the soft mask layer.

Alternatively, the fluorohydrocarbon gas having a composition of $C_xH_yF_z$, may be replaced with a fluorohydrocarbon gas having a composition of $C_jH_kF_l$, wherein j is an integer selected from 1 and 2, and/or k is lesser than 1. In this case, the composition of the gas supplied into the process chamber further includes $O_2$, $N_2$, $H_2$, $NH_3$, $SO_2$, and/or COS. It is noted that the properties of the deposited fluorohydrocarbon polymer changes corresponding to the change in composition of the fluorohydrocarbon gas employed to generate the plasma.

Upon reaction with the carbon-based material in the soft mask layer 30, the first fluorohydrocarbon-containing plasma generates a fluorohydrocarbon-containing polymer on the sidewalls around an opening 31 in the soft mask layer 30, thereby coating the sidewalls with the polymer. The fluorohydrocarbon-containing polymer includes carbon, hydrogen, and fluorine, and the atomic concentration of carbon in the fluorohydrocarbon-containing polymer is greater than the atomic concentration of fluorine in the fluorohydrocarbon-containing polymer. In one embodiment, the fluorohydrocarbon-containing polymer includes a non-volatile compound that interacts with a non-photosensitive organic polymer in the soft mask layer 20 to form a cross-linked compound. As used herein, a compound is non-volatile if it does not evaporate in vacuum at 297.3 K.

This fluorohydrocarbon-containing polymer is herein referred to as a first "carbon-rich" fluorohydrocarbon-containing polymer 33. A "carbon-rich" fluorohydrocarbon-containing polymer herein refers to a polymer in which the atomic concentration of carbon is greater than the atomic concentration of fluorine. In other words, the atomic ratio of carbon to fluorine is greater than 1 within any "carbon-rich" polymer.

The first carbon-rich fluorohydrocarbon-containing polymer 33 includes hydrogen at an atomic concentration that is at least one half of the atomic concentration of carbon in the first carbon-rich fluorohydrocarbon-containing polymer 33. In one embodiment, the atomic ratio of hydrogen to carbon in the first carbon-rich fluorohydrocarbon-containing polymer 33 is between 0.5 and 3.0.

The first carbon-rich fluorohydrocarbon-containing polymer 33 is a carbon-based polymer, i.e., more than 10% of all bonds therein are bonded to at least one carbon atom. In one embodiment, the first carbon-rich fluorohydrocarbon-containing polymer 33 includes carbon at an atomic concentration between 30% and 40%, hydrogen at an atomic concentration between 40% and 50%, fluorine at an atomic concentration between 5.0% and 10.0%, and oxygen at an atomic concentration less than 5%.

The thickness of the first carbon-rich fluorohydrocarbon-containing polymer 33 on the sidewalls of the soft mask layer 30 is thick enough to prevent ions of the first fluorohydrocarbon-containing plasma from penetrating the first carbon-rich fluorohydrocarbon-containing polymer 33, and from interacting with the carbon-based material of the soft mask layer 30. The thicknesses of the first carbon-rich fluorohydrocarbon-containing polymer 33 can be from 1 nm to 5 nm depending on the process conditions employed to generate the first fluorohydrocarbon-containing plasma.

In one embodiment, the first carbon-rich fluorohydrocarbon-containing polymer 33 is not etchable with any fluorohydrocarbon-containing plasma in the absence of oxygen an at a plasma energy less than 1 keV.

The first exemplary structure illustrated in FIG. 2 is a patterned structure that includes a stack including, from bottom to top, the substrate 10, the hard mask layer 20, which is not carbon-based, and the soft mask layer 20 including a carbon-based material. The first carbon-rich fluorohydrocarbon-containing polymer 33 is located on sidewalls around the opening 31 of the soft mask layer 30. The first carbon-rich fluorohydrocarbon-containing polymer 33 contiguously extends over an entirety of the sidewalls between a bottom surface of the opening 31 and a topmost surface of the soft mask layer 30.

In one embodiment, the first carbon-rich fluorohydrocarbon-containing polymer 33 deposited from the first fluorohydrocarbon-containing plasma has a greater carbon concentration in atomic percentage than the soft mask layer 20.

Figure 3:
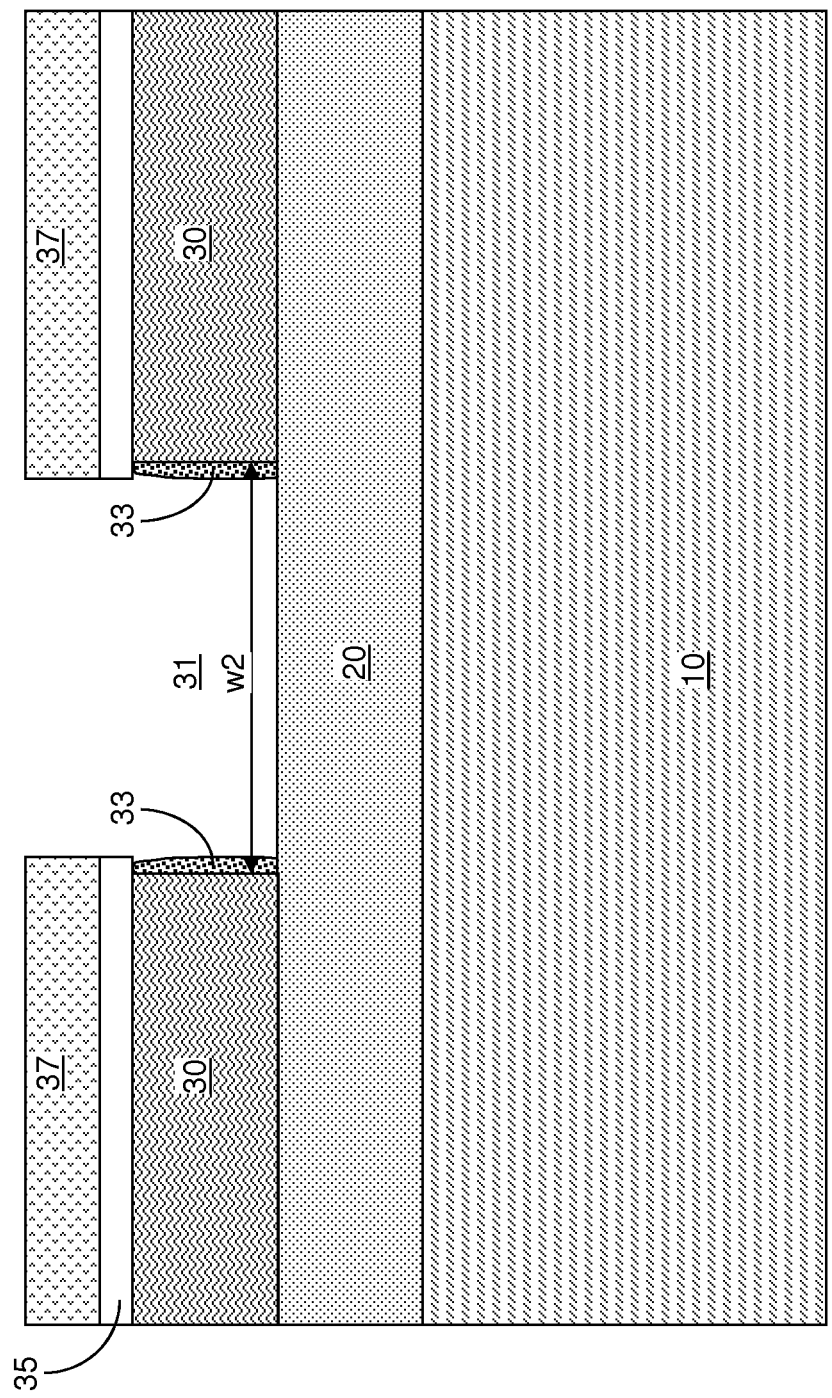
FIG. 3 is a vertical cross-sectional view of the first exemplary structure after completion of the transfer of the pattern in the photoresist into the soft mask layer according to the first embodiment of the present disclosure.

Referring to FIG. 3, the transfer of the pattern in the photoresist 37 proceeds to the bottom surface of the soft mask layer 30 as the first anisotropic etch continues until a top surface of the hard mask layer 20 is exposed. The hard mask layer 20 can be employed as an etch stop layer for the first anisotropic etch. For example, the change in the composition of the ions in the first fluorohydrocarbon-containing plasma that accompanies physical exposure of the top surface of the hard mask layer 20 can be detected by optical means, and employed as a signal that triggers an immediate termination, or a delayed termination (after an overetch), of the first anisotropic etch.

In the patterned structure of FIG. 3, the first carbon-rich fluorohydrocarbon-containing polymer 33 contiguously extends over an entirety of the sidewalls between the bottommost surface of the soft mask layer 30 and a topmost surface of the soft mask layer 30.

The distance between two opposing sidewalls of the soft mask layer 30 around the opening 31 is herein referred to as a second width w2. Because the first carbon-rich fluorohydrocarbon-containing polymer 33 protects the portions of the soft mask layer 30 that are not directly exposed to the first fluorohydrocarbon-containing plasma, the opening 31 does not become wider with the progression of the first anisotropic etch. Thus, the second width w2 can be substantially the same as the first width w1.

At least an upper portion of the photoresist 37 is consumed during the anisotropic etch of the soft mask layer 30. A lower portion of the photoresist 37 may remain when the topmost surface of the hard mask layer 20 is physically exposed within the opening 31, or the entirety of the photoresist 37 may be consumed before the topmost surface of the hard mask layer 20 is physically exposed within the opening 31. None, a portion, or all, of the optional dielectric oxide layer 35 may be consumed during the anisotropic etch of the soft mask layer 30. Correspondingly, the optional dielectric oxide layer 35 may, or may not, be present at the end of the anisotropic etch step for patterning the soft mask layer 30, i.e., when the topmost surface of the hard mask layer 20 is physically exposed.

Figure 4:
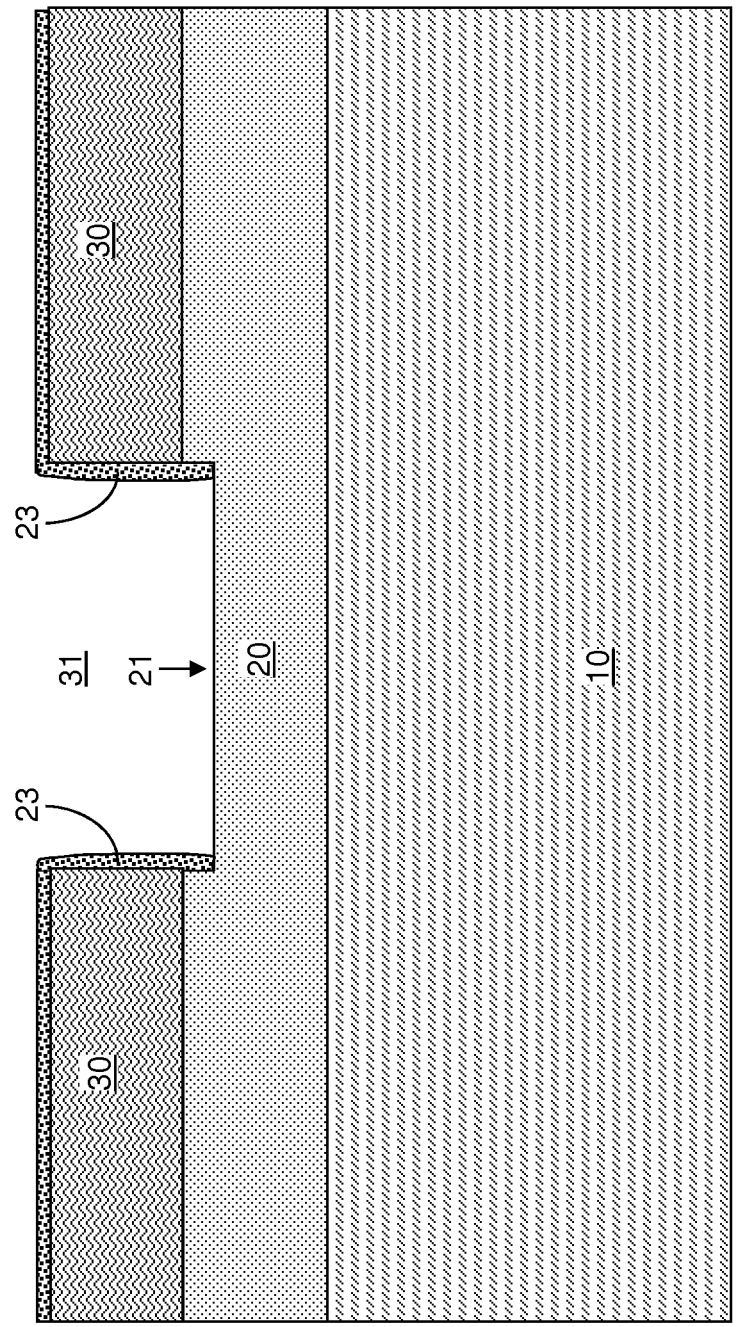
FIG. 4 is a vertical cross-sectional view of the first exemplary structure during transfer of the pattern in the soft mask layer into a hard mask layer according to the first embodiment of the present disclosure.

Referring to FIG. 4, the first exemplary structure is placed into a process chamber configured for a plasma etch. This process chamber can be the same as, or can be different from, the process chamber employed for the first anisotropic etch. A second anisotropic etch employing a second fluorohydrocarbon-containing plasma is performed on the first exemplary structure. The pattern in the soft mask layer 30 is transferred into an upper portion of a second anisotropic etch into the hard mask layer 20 during the initial phase of the second anisotropic etch.

The composition of the gas supplied into the process chamber includes one or more fluorohydrocarbon gas (hereafter referred to as "the fluorohydrocarbon gas") having a composition of $C_pH_qF_r$, wherein p is an integer selected from 3, 4, 5, and 6, q and r are positive integers, and q is greater than r. For example, the fluorohydrocarbon gas include one or more of $C_3H_5F_3$, $C_3H_6F_2$, $C_3H_7F$, $C_3H_4F_2$, $C_3H_5F$, $C_3H_3F$, $C_4H_6F_4$, $C_4H_7F_3$, $C_4H_8F_2$, $C_4H_9F$, $C_4H_5F_3$, $C_4H_6F_2$, $C_4H_7F$, $C_4H_4F_2$, $C_4H_5F$, $C_5H_7F_5$, $C_5H_8F_4$, $C_5H_9F_3$, $C_5H_{10}F_2$, $C_5H_{11}F$, $C_5H_6F_4$, $C_5H_7F_3$, $C_5H_8F_2$, $C_5H_9F$, $C_5H_5F_3$, $C_5H_6F_2$, $C_5H_7F$, $C_6H_8F_6$, $C_6H_9F_5$, $C_6H_{10}F_4$, $C_6H_{11}F_3$, $C_6H_{12}F_2$, $C_6H_{13}F$, $C_6H_7F_5$, $C_6H_8F_4$, $C_6H_9F_3$, $C_6H_{10}F_2$, $C_6H_{11}F$, $C_6H_6F_4$, $C_6H_7F_3$, $C_6H_8F_2$, and $C_6H_9F$. Correspondingly, the second fluorohydrocarbon-containing plasma includes ions of $C_pH_qF_r$. Optionally, the composition of the gas supplied into the process chamber can include $O_2$ or CO, $N_2$, Ar, and or He. In other words, the second fluorohydrocarbon-containing plasma optionally includes a plasma of $O_2$ or CO, $N_2$, Ar, and or He. The composition and/or energy of the second fluorohydrocarbon-containing plasma can be the same as, or different from, the composition and/or energy of the first hydrocarbon-containing plasma employed for the first anisotropic etch. The fluorohydrocarbon gas having a composition of $C_pH_qF_r$, wherein p is an integer selected from 3, 4, 5, and 6, q and r are positive integers, and q is greater than r, can be any of the fluorohydrocarbon gases having the formula of $C_xH_yF_z$ as described above. In one embodiment, the fluorohydrocarbon gas having a composition of $C_pH_qF_r$ can be selected from any of the above listed non-limiting specific examples of $C_xH_yF_z$, wherein x is an integer selected from 3, 4, 5, and 6, y and z are positive integers, and y is greater than z, which include alkanes, alkenes, and alkynes.

Upon reaction with the carbon-based material in the soft mask layer 30, the second fluorohydrocarbon-containing plasma generates a fluorohydrocarbon-containing polymer on the top surface of the soft mask layer 30, sidewalls of the soft mask layer 30 (around the opening 31 in the soft mask layer 30), and sidewalls of the hard mask layer 20 (around an opening 21 in the hard mask layer 20). The fluorohydrocarbon-containing polymer coats the top surface of the soft mask layer 30, the sidewalls of the soft mask layer 30, and the sidewalls of the hard mask layer 20. The fluorohydrocarbon-containing polymer includes carbon, hydrogen, and fluorine, and the atomic concentration of carbon in the fluorohydrocarbon-containing polymer is greater than the atomic concentration of fluorine in the fluorohydrocarbon-containing polymer. In one embodiment, the fluorohydrocarbon-containing polymer includes a non-volatile compound that interacts with a non-photosensitive organic polymer in the soft mask layer 20 to form a cross-linked compound.

This fluorohydrocarbon-containing polymer is herein referred to as a second carbon-rich fluorohydrocarbon-containing polymer 23. The second carbon-rich fluorohydrocarbon-containing polymer 23 can have a composition that is the same as, or different from, the composition of the first carbon-rich fluorohydrocarbon-containing polymer 33 generated by the first anisotropic etch described above.

The second carbon-rich fluorohydrocarbon-containing polymer 23 includes hydrogen at an atomic concentration that is at least one half of the atomic concentration of carbon in the second carbon-rich fluorohydrocarbon-containing polymer 23. In one embodiment, the atomic ratio of hydrogen to carbon in the second carbon-rich fluorohydrocarbon-containing polymer 23 is between 0.5 and 3.0.

The second carbon-rich fluorohydrocarbon-containing polymer 23 is a carbon-based polymer. In one embodiment, the second carbon-rich fluorohydrocarbon-containing polymer 23 includes carbon at an atomic concentration between 30% and 40%, hydrogen at an atomic concentration between 40% and 50%, fluorine at an atomic concentration between 5.0% and 10.0%, and oxygen at an atomic concentration less than 5%.

The thickness of the second carbon-rich fluorohydrocarbon-containing polymer 23 on the sidewalls of the soft mask layer 30 is thick enough to prevent ions of the second fluorohydrocarbon-containing plasma from penetrating the second carbon-rich fluorohydrocarbon-containing polymer 23, and from interacting with the carbon-based material of the soft mask layer 30. The thicknesses of the second carbon-rich fluorohydrocarbon-containing polymer 23 can be from 1 nm to 5 nm depending on the process conditions employed to generate the second fluorohydrocarbon-containing plasma.

Because the carbon-rich fluorohydrocarbon-containing polymers are generated in significant quantities in the second anisotropic etch process of the present disclosure, the energy of the second fluorohydrocarbon-containing plasma can be significantly lowered relative to the energy employed for conventional anisotropic etch processes. The quantity of the carbon-rich fluorohydrocarbon-containing polymers is significant enough to be measurable employing analytical instruments available in the art such as Auger electron spectroscopy (AES). Specifically, while conventional plasma requires minimum ion energy of 200 eV, the ions in the second fluorohydrocarbon-containing plasma can have an energy less than 200 eV. The ions in the second fluorohydrocarbon-containing plasma of the present disclosure can have an average kinetic energy between 10 eV and 1 keV. In one embodiment, the ions in the second fluorohydrocarbon-containing plasma of the present disclosure can have an average kinetic energy in a range from 10 eV to 100 eV.

In one embodiment, the second carbon-rich fluorohydrocarbon-containing polymer 23 is not etchable with any fluorohydrocarbon-containing plasma in the absence of oxygen an at a plasma energy less than 1 keV.

The first exemplary structure illustrated in FIG. 4 is a patterned structure that includes a material stack. The material stack includes, from bottom to top, the substrate 10, the hard mask layer 20, which is not carbon-based, and the soft mask layer 20 including a carbon-based material. The second carbon-rich fluorohydrocarbon-containing polymer 23 is located the top surface and sidewalls of the soft mask layer 30, and on sidewalls of the hard mask layer 20. The second carbon-rich fluorohydrocarbon-containing polymer 23 contiguously extends over an entirety of the sidewalls between a bottom surface of the opening 21 within the hard mask layer 20 and the topmost surface of the soft mask layer 30.

In one embodiment, the second carbon-rich fluorohydrocarbon-containing polymer 23 deposited from the second fluorohydrocarbon-containing plasma has a greater carbon concentration in atomic percentage than the soft mask layer 20.

Figure 5:
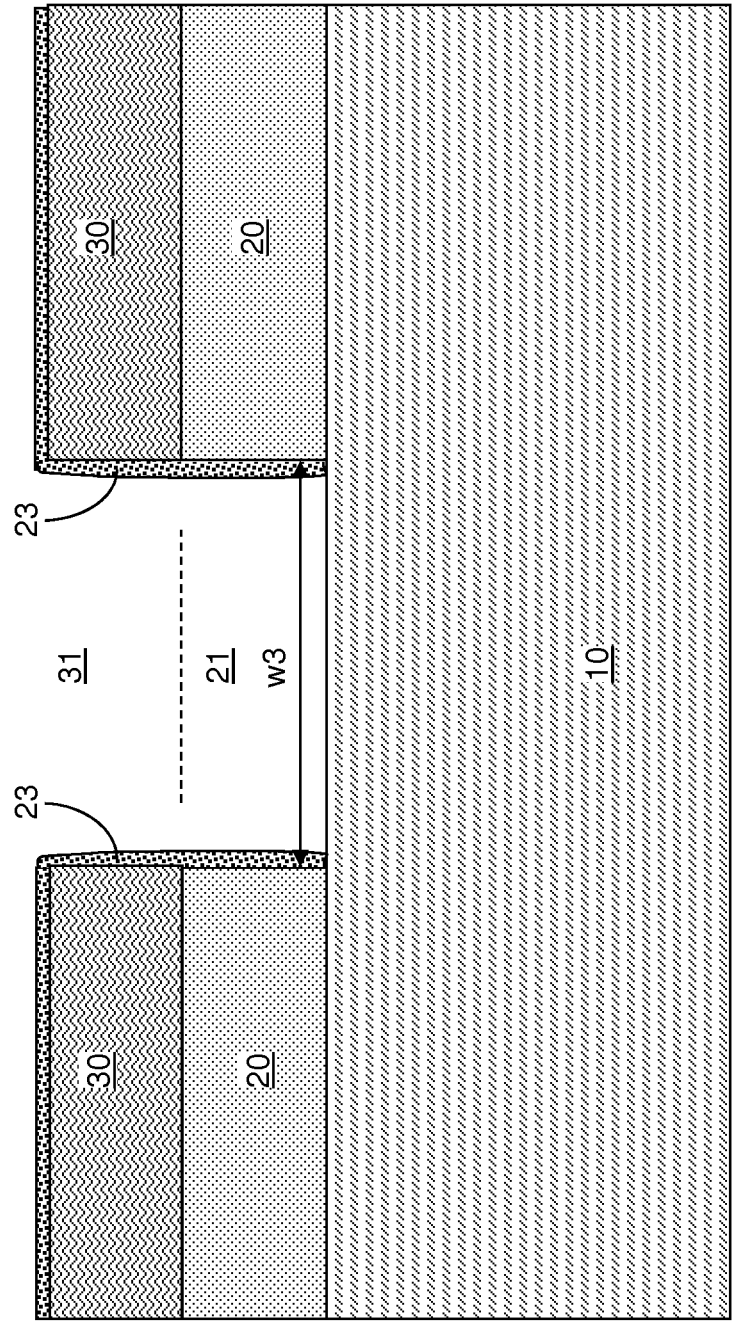
FIG. 5 is a vertical cross-sectional view of the first exemplary structure after transfer of the pattern in the soft mask layer into the hard mask layer according to the first embodiment of the present disclosure.

Referring to FIG. 5, the transfer of the pattern in soft mask layer 20 proceeds to the bottom surface of the hard mask layer 20 as the second anisotropic etch continues until a top surface of the substrate 10 is exposed. The substrate 10 can be employed as an etch stop layer for the second anisotropic etch. For example, the change in the composition of the ions in the second fluorohydrocarbon-containing plasma that accompanies physical exposure of the top surface of the substrate 10 can be detected by optical means, and employed as a signal that triggers an immediate termination, or a delayed termination (after an overetch), of the second anisotropic etch.

In the patterned structure of FIG. 5, the second carbon-rich fluorohydrocarbon-containing polymer 23 contiguously extends from above the top surface of the soft mask layer, over an entirety of the sidewalls of the soft mask layer 30 and the hard mask layer 20, and to the top surface of the substrate 10.

The lateral distance between two opposing sidewalls of the hard mask layer 20 is herein referred to as a third width w3. Because the second carbon-rich fluorohydrocarbon-containing polymer 23 protects the hard mask layer 20 and the portions of the soft mask layer 30 that are not directly exposed to the second fluorohydrocarbon-containing plasma, the opening 21 in the hard mask layer does not become wider with the progression of the second anisotropic etch. Thus, the third width w2 can be substantially the same as second width w2.

Figure 6:
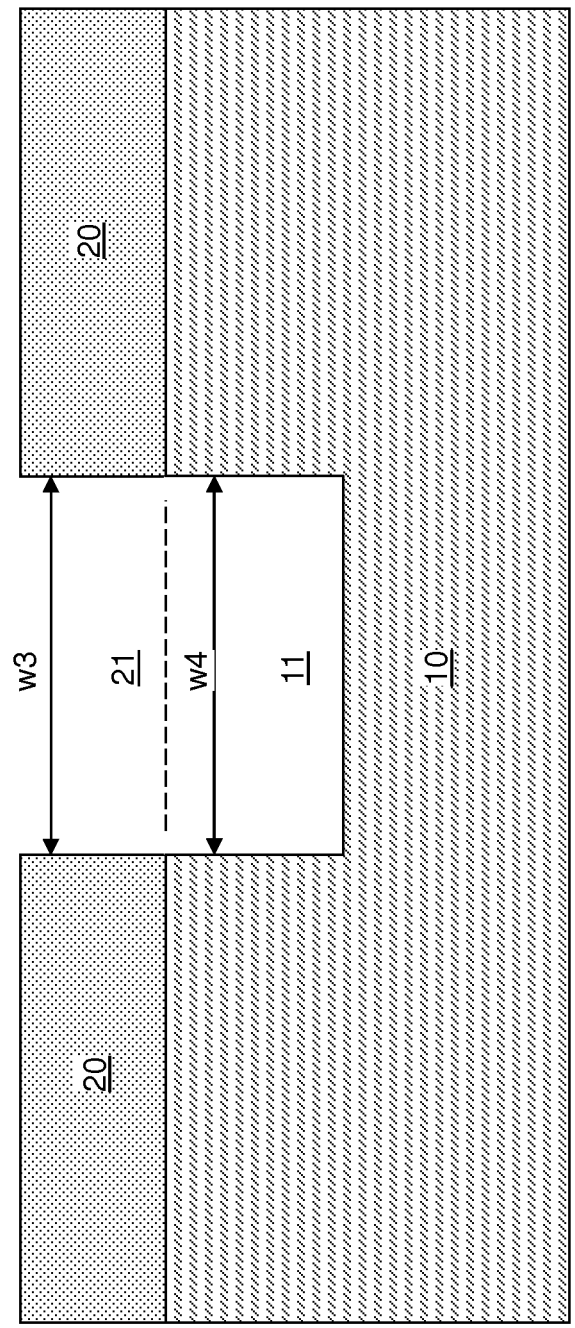
FIG. 6 is a vertical cross-sectional view of the first exemplary structure after removal of the soft mask layer and transfer of the pattern in the hard mask layer into an underlying substrate according to the first embodiment of the present disclosure.

Referring to FIG. 6, the soft mask layer 30 can be removed, for example, by ashing or by a wet etch. The second carbon-rich fluorohydrocarbon-containing polymer 23 can be removed, for example, by another wet etch employing an organic solvent.

The pattern in the hard mask layer 20 is transferred into the substrate 10 to form a cavity 11 having a fourth width w4, which can be substantially the same as the third width w3. The fourth width w4 can be about the same as the first width w1, i.e., the lateral dimension of the cavity 11 formed in the substrate 10 can be substantially the same as the width of the opening in the photoresist 37. Thus, the combination of the first anisotropic etch and the second anisotropic etch of the present disclosure can replicate lateral dimensions in a patterned photoresist in an underlying substrate with high fidelity.

Figure 7:
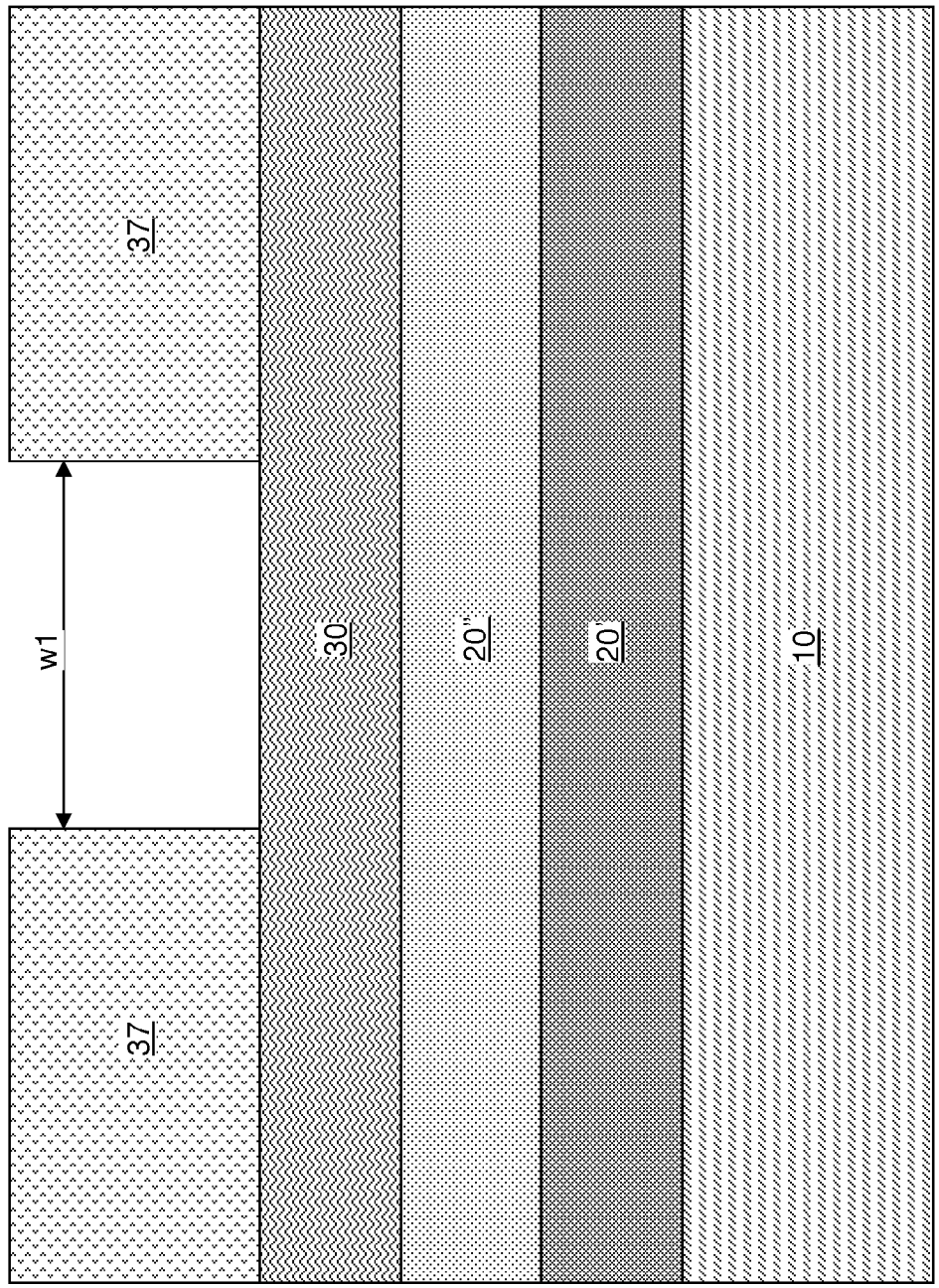
FIG. 7 is a vertical cross-sectional view of a second exemplary structure after patterning of a photoresist according to a second embodiment of the present disclosure.

Referring to FIG. 7, a second exemplary structure according to a second embodiment of the present disclosure is derived from the first exemplary structure of FIG. 1 by substituting a stack of multiple hard mask layers for the hard mask layer 20 in the first exemplary structure. For example, a stack, from bottom to top, of a lower hard mask layer 20' and an upper hard mask layer 20". Each of the lower hard mask layer 20' and the upper hard mask layer 20 can have any of the material that can be employed for the hard mask layer 20 in the first exemplary structure. The thickness of each of the lower hard mask layer 20' and the upper hard mask layer 20" can be the same as the thickness of the hard mask layer 20. The lower hard mask layer 20' and the upper hard mask layer 20" have different compositions. Each of the lower hard mask layer 20' and the upper hard mask layer 20" can be formed, for example, by chemical vapor deposition (CVD).

Figure 8:
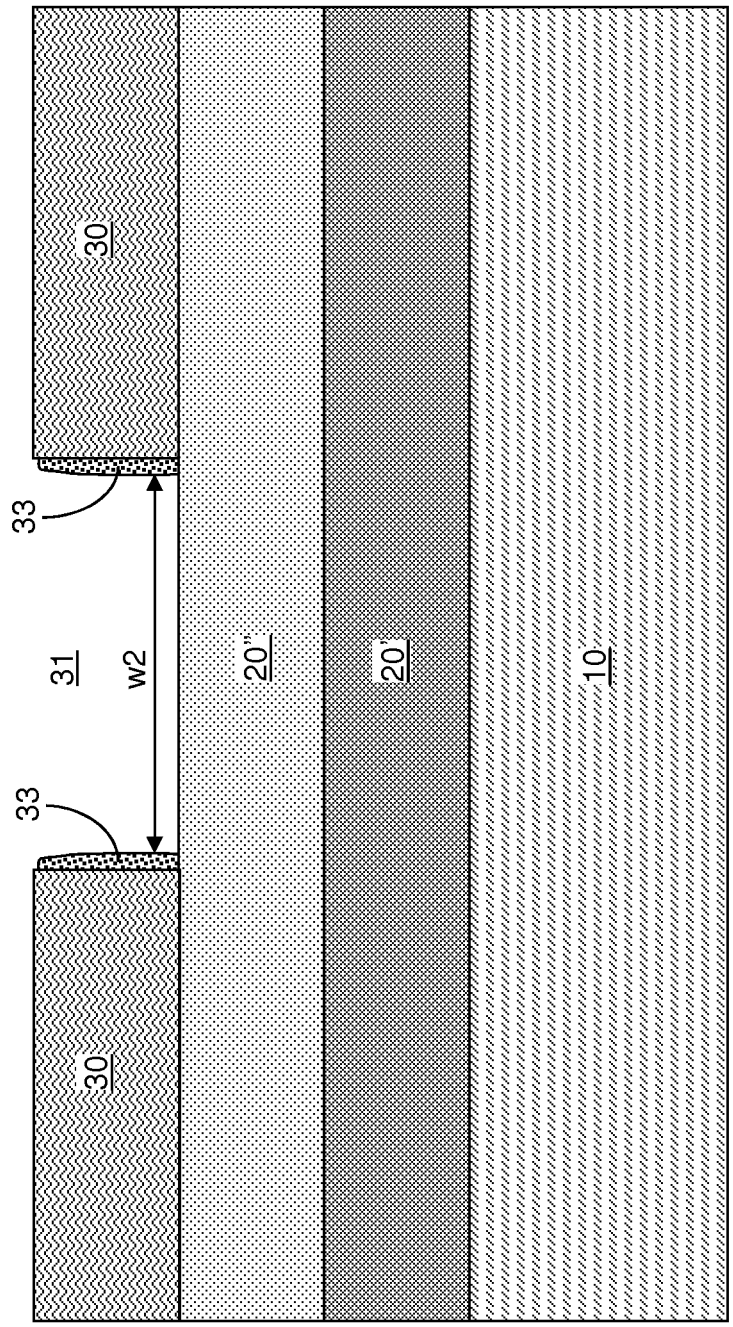
FIG. 8 is a vertical cross-sectional view of the second exemplary structure after transfer of the pattern in the photoresist into the soft mask layer and subsequent removal of the photoresist according to the second embodiment of the present disclosure.

Referring to FIG. 8, the processing steps of FIGS. 2-4 according to the first embodiment are performed to form an opening 31 in the soft mask layer 20. The upper hard mask layer 20" functions as the hard mask layer 20 in the first embodiment in these processing steps.

Figure 9:
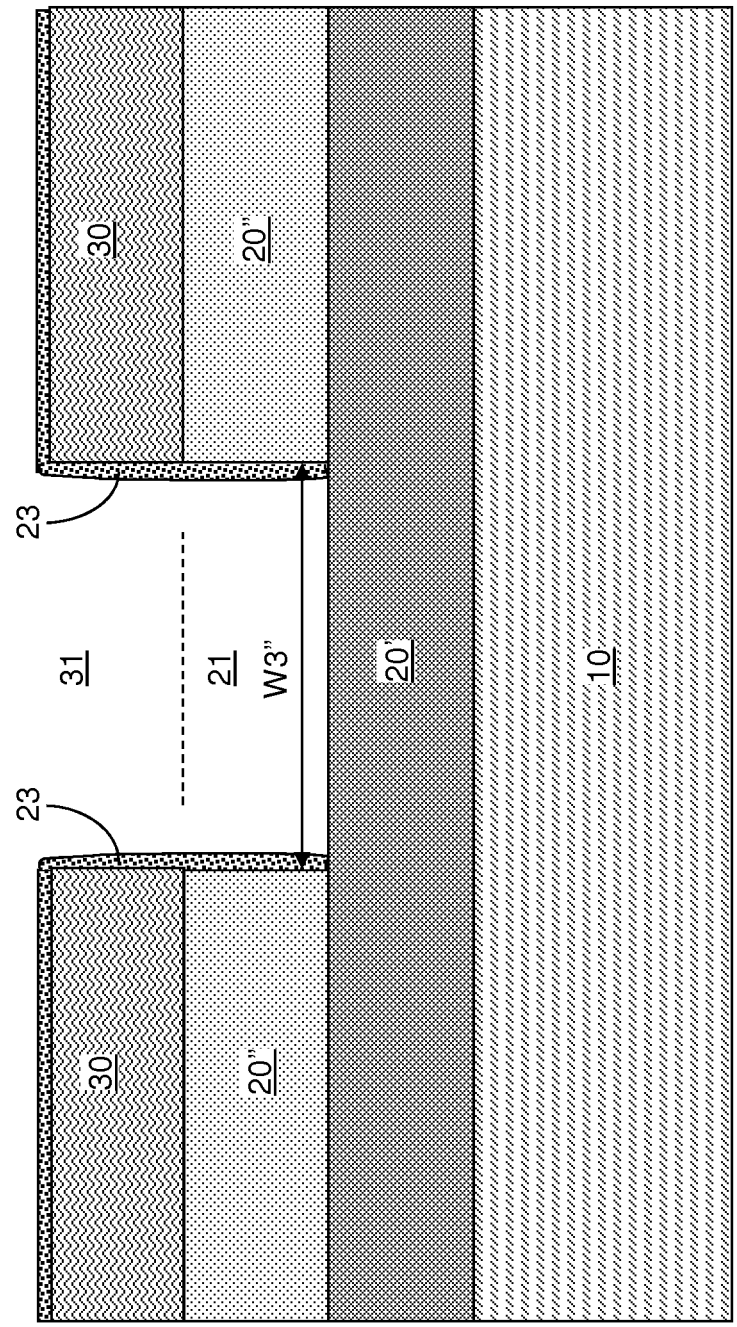
FIG. 9 is a vertical cross-sectional view of the second exemplary structure after transfer of the pattern in the soft mask layer into an upper hard mask layer according to the second embodiment of the present disclosure.

Referring to FIG. 9, the processing steps of FIGS. 5 and 6 according to the first embodiment are performed to form an opening in the upper hard mask layer 20" that functions as the hard mask layer 20 in the first embodiment in these processing steps. The lateral distance between two opposing sidewalls of the upper hard mask layer 20" is herein referred to as an upper third width w3", which can be substantially the same as the first width w1.

Figure 10:
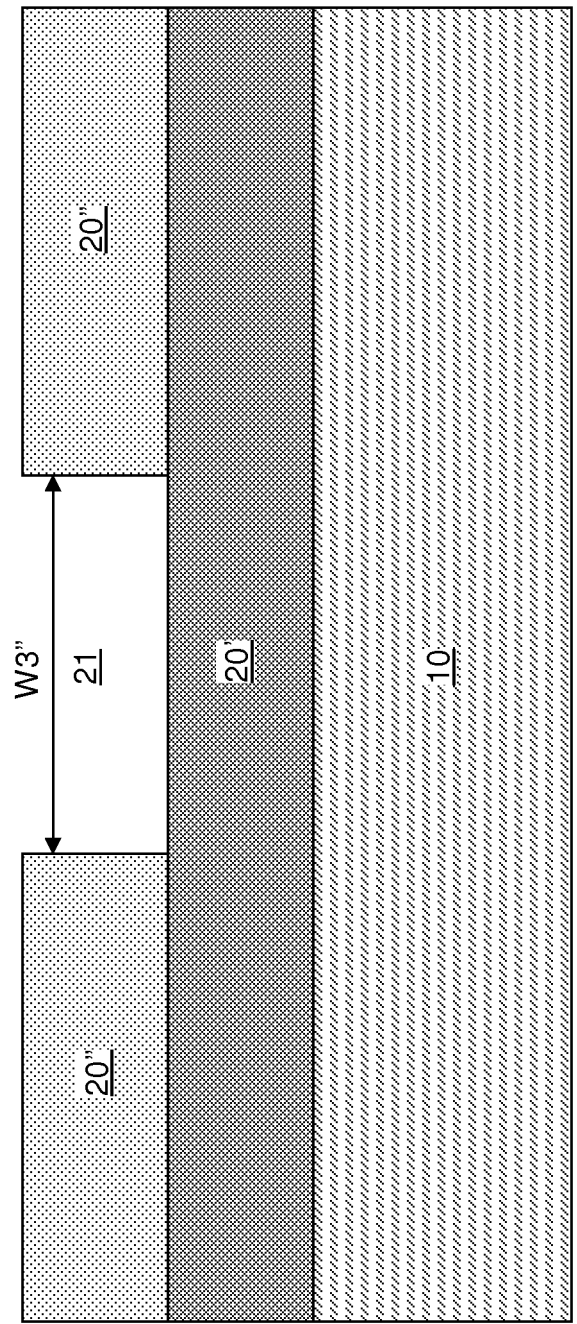
FIG. 10 is a vertical cross-sectional view of the second exemplary structure after removal of the soft mask layer according to the second embodiment of the present disclosure.

Referring to FIG. 10, the soft mask layer 30 and the second carbon-rich fluorohydrocarbon-containing polymer 23 are removed, for example, by ashing, at least one wet etch, or a combination thereof.

Figure 11:
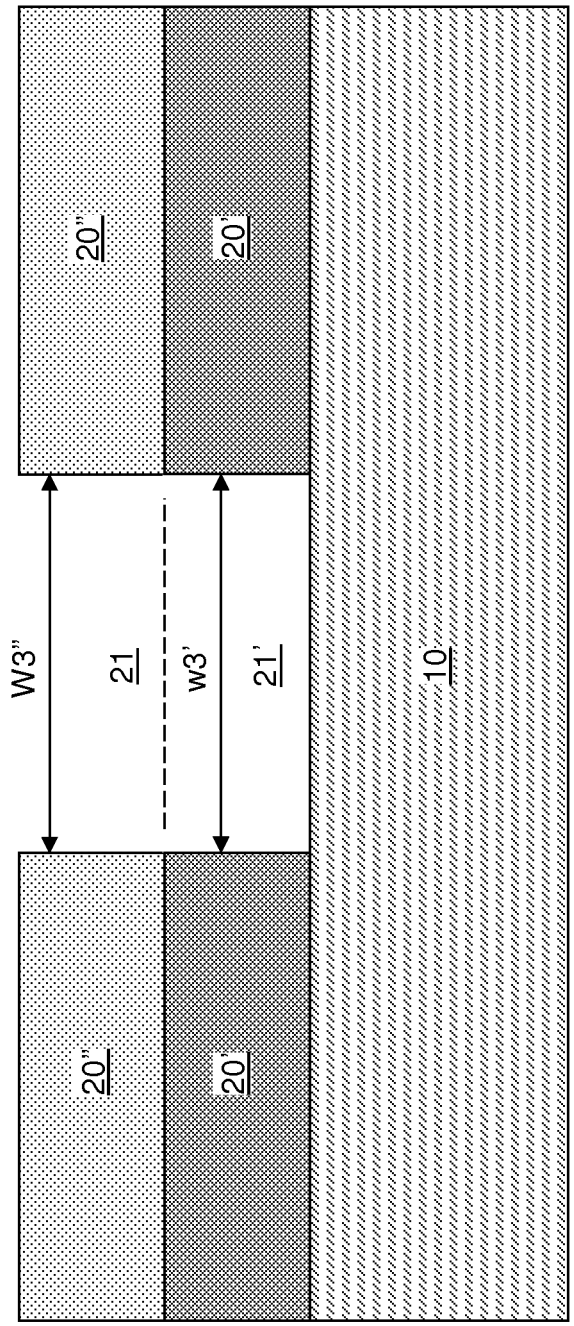
FIG. 11 is a vertical cross-sectional view of the second exemplary structure after transfer of the pattern in the upper hard mask layer into a lower hard mask layer.

Referring to FIG. 11, the pattern in the upper hard mask layer 20" is transferred into the lower hard mask layer 20' employing an anisotropic etch that employs the upper hard mask layer 20" as an etch mask. The lateral distance between two opposing sidewalls of the lower hard mask layer 20' is herein referred to as a lower third width w3', which can be substantially the same as the upper third width w3".

Figure 12:
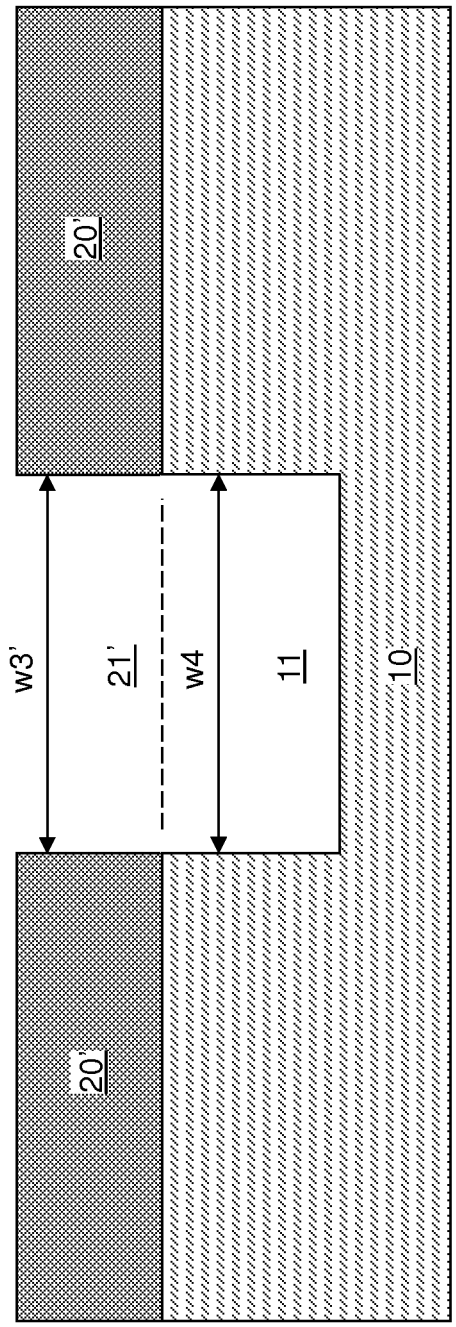
FIG. 12 is a vertical cross-sectional view of the second exemplary structure after removal of the upper hard mask layer and transfer of the pattern in the lower hard mask layer into an underlying substrate according to the second embodiment of the present disclosure.

Referring to FIG. 12, the upper hard mask layer 20" is removed selective to the lower hard mask layer 20', for example, by a wet etch that etches the upper hard mask layer 20" and does not etch the lower hard mask layer 20'. The pattern in the lower hard mask layer 20' is transferred into the substrate 10 to form a cavity 11 having a fourth width w4, which can be substantially the same as the lower third width w3'. The fourth width w4 can be substantially the same as the first width w1, i.e., the lateral dimension of the cavity 11 formed in the substrate 10 can be substantially the same as the width of the opening in the photoresist 37. Thus, the combination of the first anisotropic etch and the second anisotropic etch of the present disclosure can replicate lateral dimensions in a patterned photoresist in an underlying substrate with high fidelity.

While the present disclosure has been described with embodiments in which the first anisotropic etch and the second anisotropic etch are sequentially employed, embodiments of the present disclosure that employs the first anisotropic etch, and does not employ the second anisotropic etch can also be employed. Further, embodiments of the present disclosure that employs the second anisotropic etch, and does not employ the first anisotropic etch can also be employed. In embodiments in which the first anisotropic etch or the second anisotropic etch of the present disclosure is not employed, the first anisotropic etch or the second anisotropic etch can be replaced with anisotropic etches known in the art.

The use of the first anisotropic etch and/or the second anisotropic etch minimizes changes in the lateral dimensions of the pattern between a photoresist and a substrate by passivating sidewalls of the soft mask layer and/or at least one hard mask layer with at least one carbon-rich fluorohydrocarbon-containing polymer. A high aspect ratio can be employed for openings lithographically patterned photoresist, as well as for cavities formed in the substrate by the transfer of the pattern in the photoresist. In addition, the lack of widening of the opening or cavity in the soft mask layer, the at least one hard mask layer, and the substrate prevents pattern collapse during the first and second anisotropic etches. Thus, the fidelity of the pattern replicated in the cavities in the substrate with respect to the original pattern as lithographically printed on the photoresist can be significantly enhanced through the use of the first and/or second fluorohydrocarbon-containing plasma(s) of the present disclosure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a patterned structure comprising:
   forming a stack comprising, from bottom to top, a substrate, a hard mask layer that is not carbon-based, a soft mask layer including a carbon-based material, and a photoresist;
   lithographically patterning said photoresist; and
   transferring a pattern in said photoresist into said soft mask layer employing an anisotropic etch, wherein a carbon-rich polymer including carbon and fluorine is formed on sidewalls around an opening of said soft mask layer, wherein an atomic ratio of carbon to fluorine is greater than 1 within said carbon-rich polymer, wherein said anisotropic etch employs a fluorohydrocarbon-containing plasma, and said carbon-rich polymer is generated by interaction of said fluorohydrocarbon-containing plasma with said soft mask layer, and wherein said fluorohydrocarbon-containing includes ions of $C_xH_yF_z$, wherein x is an integer selected from 3, 4, 5, and 6, y and z are positive integers, and y is greater than z.

2. The method of Claim 1, further comprising:
   removing said photoresist after transferring said pattern into said soft mask layer; and
   transferring a pattern in said soft mask layer into said hard mask layer.

3. The method of claim 2, wherein said pattern in said soft mask layer is transferred into said hard mask layer by another anisotropic etch employing another fluorohydrocarbon-containing plasma.

4. The method of claim 3, wherein another carbon-rich polymer contacting sidewalls of said hard mask layer is generated by interaction of said fluorohydrocarbon-containing plasma with said soft mask layer.

5. The method of claim 4, wherein said another carbon-rich polymer contiguously extends over a top surface of said soft mask layer, sidewalls of said soft mask layer, and said sidewalls of said hard mask layer.

6. The method of claim 3, wherein said another fluorohydrocarbon-containing plasma includes ions of $C_pH_qF_r$, wherein p is an integer selected from 3, 4, 5, and 6, q and r are positive integers, and q is greater than r.

7. The method of claim 3, wherein said stack further comprises another hard mask layer formed between said substrate and said hard mask layer, and said method further comprises:
   removing said soft mask layer after said hard mask layer is patterned; and
   transferring a pattern in said hard mask layer into said another hard mask layer employing an additional anisotropic etch.

8. The method of claim 1, wherein said carbon-rich polymer includes hydrogen at an atomic concentration that is at least one half of said atomic concentration of carbon in said carbon-rich polymer.

9. A method of forming a patterned structure comprising:
   forming a stack comprising, from bottom to top, a substrate, a hard mask layer that is not carbon-based, a soft mask layer including a carbon-based material, and a photoresist;
   lithographically patterning said photoresist;
   patterning said soft mask layer by transferring a pattern in said photoresist into said soft mask layer; and
   transferring a pattern in said soft mask layer into said hard mask layer employing an anisotropic etch, wherein a carbon-rich polymer including carbon and fluorine is formed contiguously on a top surface of said soft mask layer, on sidewalls of said soft mask layer, and on sidewalls of said hard mask layer, wherein an atomic ratio of carbon to fluorine is greater than 1 within said carbon-rich polymer, wherein said anisotropic etch employs a fluorohydrocarbon-containing plasma, and said carbon-rich polymer is generated by interaction of said fluorohydrocarbon-containing plasma with said soft mask layer, and wherein said fluorohydrocarbon-containing plasma includes ions of $C_pH_qF_r$, wherein p is an integer selected from 3, 4, 5, and 6, q and r are positive integers, and q is greater than r.

10. The method of Claim 9, wherein said pattern in said photoresist is transferred into said soft mask layer by another anisotropic etch employing another fluorohydrocarbon-containing plasma, and said method further comprises removing said photoresist after transferring said pattern in said photoresist into said soft mask layer.

11. The method of claim 1, wherein said another fluorohydrocarbon-containing plasma includes ions of $C_xH_yF_z$, wherein x is an integer selected from 3, 4, 5, and 6, y and z are positive integers, and y is greater than z.

12. The method of claim 1, wherein said stack further comprises another hard mask layer formed between said substrate and said hard mask layer, and said method further comprises:
   removing said soft mask layer after said hard mask layer is patterned; and
   transferring a pattern in said hard mask layer into said another hard mask layer employing an additional anisotropic etch.

* * * * *